(12) United States Patent
Shroff et al.

(10) Patent No.: US 9,443,804 B2
(45) Date of Patent: Sep. 13, 2016

(54) CAPPING LAYER INTERFACE INTERRUPTION FOR STRESS MIGRATION MITIGATION

(71) Applicants: Mehul D. Shroff, Austin, TX (US);
Douglas M. Reber, Austin, TX (US);
Edward O. Travis, Austin, TX (US)

(72) Inventors: Mehul D. Shroff, Austin, TX (US);
Douglas M. Reber, Austin, TX (US);
Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 96 days.

(21) Appl. No.: 13/956,068

(22) Filed: Jul. 31, 2013

(65) Prior Publication Data

US 2015/0035151 A1 Feb. 5, 2015

(51) Int. Cl.
*H01L 23/48* (2006.01)
*H01L 23/532* (2006.01)
*H01L 21/768* (2006.01)

(52) U.S. Cl.
CPC ....... *H01L 23/53238* (2013.01); *H01L 21/768* (2013.01); *H01L 23/5329* (2013.01); *H01L 2924/0002* (2013.01)

(58) Field of Classification Search
CPC ... H01L 21/76801–21/76814; H01L 45/1683; H01L 2221/10–2221/1089; H01L 2224/05006–2224/05093; H01L 2224/05546; H01L 21/02063; H01L 21/486; H01L 21/76877–21/76879; H01L 21/76897; H01L 23/481–23/4855; H01L 23/5226; H01L 23/5384

See application file for complete search history.

(56) References Cited

U.S. PATENT DOCUMENTS

| | | | |
|---|---|---|---|
| 5,712,510 A | 1/1998 | Bui et al. | |
| 2004/0113238 A1* | 6/2004 | Hasunuma et al. | 257/636 |
| 2005/0116350 A1* | 6/2005 | Ng et al. | 257/770 |
| 2013/0113102 A1* | 5/2013 | Bao et al. | 257/751 |

OTHER PUBLICATIONS

A. Heryanto et al., "Study of Stress Migration and Electromigration Interaction in Copper/Low-κ Interconnects", 2010, pp. 586-590.
E.T. Ogawa et al., "Stress-Induced Voiding Under Vias Connected to Wide Cu Metal Leads", 2002, pp. 312-321, 40th Annual International Reliability Physics Symposium.
Gavin D. R. Hall et al., "Impact of Via Interactions and Metal Slotting on Stress Induced Voiding", 46th Annual International Reliability Physics Symposium, 2008, pp. 392-398, Phoenix.
H. Matsuyama et al., "Stress Migration Phenomena in Narrow Copper Lines", 2006, pp. 28-30, IIRW Final Report.
T. Kouno et al., "Stress-Induced Voiding Under Vias Connected to "Narrow" Copper Lines", Electron Devices Meeting, 2005, 187-190.

* cited by examiner

*Primary Examiner* — Cuong B Nguyen

(57) ABSTRACT

A semiconductor device includes a substrate, a dielectric layer supported by the substrate, an interconnect adjacent the dielectric layer, the interconnect including a conduction material and a barrier material disposed along sidewalls of the interconnect between the conduction material and the dielectric layer, and a layer disposed over the interconnect to establish an interface between the conduction material, the barrier material, and the layer. A plate is disposed along a section of the interconnect to interrupt the interface.

17 Claims, 5 Drawing Sheets

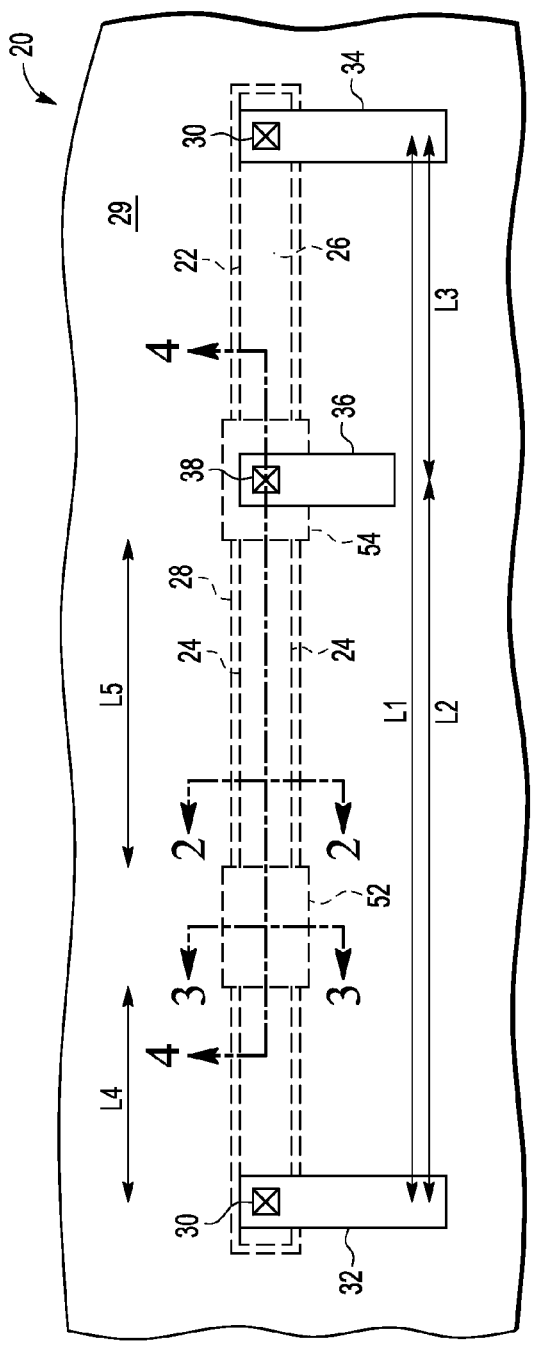
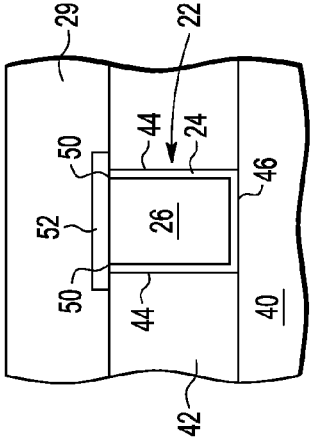
FIG. 1
FIG. 2
FIG. 3

CAPPING LAYER INTERFACE INTERRUPTION FOR STRESS MIGRATION MITIGATION

FIELD OF INVENTION

The present embodiments relate to semiconductor devices.

BACKGROUND

Stress migration, also referred to as stress-induced voiding or cavitation, is a post-fabrication failure mechanism for semiconductor devices. Stress migration causes voids to form in metallization interconnect lines. An open circuit may occur if enough voids accumulate in a location along the interconnect line. An accumulation of voids can also lead to degraded circuit performance through substantially higher resistances.

The voids arise from vacancies in the interconnect metallization. The vacancies form during fabrication processes, such as during deposition and electroplating. For example, an electroplated metal layer is often left with grains. Vacancies are present between the grains. Oftentimes, when the semiconductor device is tested immediately after fabrication, the vacancies remain harmlessly distributed at various positions along the conductors.

Device failures subsequently occur as the vacancies migrate and accumulate to form the voids. The vacancies migrate due to stress gradients arising from different thermal expansion coefficients between the interconnect metal and surrounding dielectric layers. The thermal expansion coefficients of the conductor materials (e.g., aluminum and copper) may be several times greater than the thermal expansion coefficients of the substrate (e.g., silicon) and dielectric materials adjacent the interconnects. The conductors thus expand and contract at a different rate than the nearby semiconductor and dielectric materials during subsequent heating and cooling cycles. The thermal cycles may occur during subsequent fabrication processes or over time as a result of use in the field.

Vias present discontinuities in the stress fields in the conductors. As a result, the vacancies tend to migrate to, and accumulate at, the vias. As more vacancies accumulate at a particular via, a void is formed. Over time, the voids can grow and lead to an open circuit or significant increase in resistance, thereby leading to via failure.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 1 is a schematic, simplified, plan view of a semiconductor device having an interconnect with an interrupted capping layer interface configured for stress migration mitigation in accordance with one embodiment.

FIG. 2 is a schematic, simplified, cross-sectional view of the interconnect of FIG. 1 taken along lines 2-2 of FIG. 1.

FIG. 3 is a schematic, simplified, cross-sectional view of the interconnect of FIG. 1 taken along lines 3-3 of FIG. 1.

DETAILED DESCRIPTION OF THE PRESENTLY PREFERRED EMBODIMENTS

Figure 4:
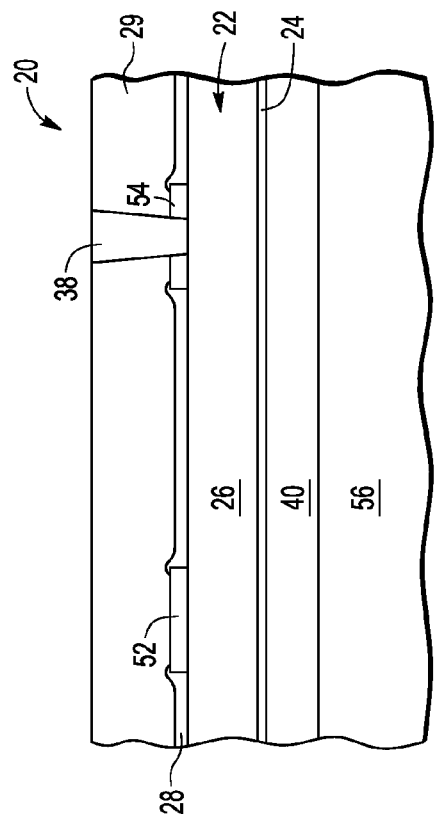
FIG. 4 is a schematic, simplified, cross-sectional view of the interconnect of FIG. 1 taken along lines 4-4 of FIG. 1.

Semiconductor devices configured for mitigating stress migration in interconnects, and methods of fabricating such devices, are described. Stress migration is mitigated by disrupting or otherwise discontinuing or interrupting an interface along the interconnect that may otherwise act as a vacancy migration path. The interface is between a capping layer, a barrier layer, and a conductor of the interconnect. The discontinuity or interruption in the interface may impede or obstruct vacancy migration along the path to prevent or limit vacancies from reaching a functional via. Stress-induced void (SIV) formation at the functional via may thus be avoided or reduced. The discontinuity may be formed through selective or other deposition of a barrier or other cladding material above or on a conductive core or material of the interconnect.

The disclosed embodiments are directed to preventing or limiting the diffusion along the interface. The interface may be interrupted over, in, or otherwise at or along a section or position of the interconnect by a cladding or other plate-shaped structure covering a conductive material or core of the interconnect. The cladding or plate may be disposed between the conductive material and the capping layer for the interconnect. In some embodiments, the cladding or plate includes a barrier material, which may correspond with the barrier material used to form a barrier layer of the interconnect. The barrier material may be selectively deposited by an ion-beam or other deposition process, or through a blanket deposition followed by a patterning etch. The cladding is not limited to barrier material-based plates, and may use other materials, such as copper. In some embodiments, the capping layer may be selectively removed to define the discontinuity in which the cladding or plate is disposed.

While stress-induced voiding is often associated with wide conductors, the disclosed embodiments may be useful for mitigating stress migration and stress-induced voiding in connection with long, narrow, and isolated interconnects. Even though wider conductors may present more vacancies for accumulation, stress-induced voiding may also occur when interconnects are long, narrow, and isolated.

The interface interruptions may bifurcate or otherwise partition the interconnects into segments so that SIV formation is prevented or decreased. The interface interruptions may thus be distributed along the interconnect, and need not be close to vias being protected thereby. The positioning of each interface interruption may define or delineate a pair of segments that do not have a length greater than an SIV formation characteristic length of the interconnect. In some cases, the SIV formation characteristic length refers to a threshold length for potentially harmful vacancy diffusion in narrow conductors. Narrow conductors shorter than the threshold length are not at risk of SIV formation from the vacancy diffusion, while those longer than the threshold length are at risk. The interface discontinuities may be positioned at intervals along interconnects to define segments shorter than the SIV formation characteristic length. For example, the barrier material of a cladding may be selectively deposited on the conductive material of the interconnect at intervals of about 10 μm to about 25 μm prior to depositing the capping layer. Further details regarding the SIV formation characteristic lengths of exemplary interconnects are set forth in, for example, Kouno et al., "Stress-Induced Voiding under Vias Connected to 'Narrow' Copper Lines," IEDM Technical Digest, pp. 187-190 (2005) and Matsuyama et al. "Stress migration phenomena in narrow copper lines," Integrated Reliability Workshop Final Report, IEEE International, pp. 28-30 (2006).

The interface interruptions provide a stress migration mitigation technique compatible with a wide variety of semiconductor devices. The interface discontinuity approach of the disclosed embodiments avoids modifying the composition of the capping layer. The disclosed embodiments are thus not limited to particular semiconductor technologies. For example, the disclosed embodiments may be used with any current or future technology using copper metallization. A variety of different semiconductor substrates may be used. The construction of the substrates of the disclosed devices may also vary. The disclosed embodiments are also not limited to any particular transistor or other device configuration.

The disclosed embodiments may provide a circuit design method with multiple options for mitigating or preventing the problems arising from stress migration. The method may be implemented as a method of configuring a semiconductor device that provides multiple ways to avoid the presence of long, narrow, and isolated lines. Having multiple options may be useful because one or more of the options may not be available or possible at some locations due to practical constraints. For example, having multiple options may be useful in connection with narrow interconnects, inasmuch as the ability to incorporate redundant vias into narrow conductors is often more difficult than with wide interconnects. If placement of a redundant via is not possible due to lack of space, then the interface discontinuity or interruption may be pursued to prevent the conductor from qualifying as a long, narrow interconnect at risk of SIV formation. In some embodiments, interface interruptions are used to provide a semiconductor device that lacks any narrow interconnects with an untreated or otherwise unaddressed segment longer than the SIV formation characteristic length.

The circuit design methodology may be implemented by a router or other design layout tool or other computer-implemented design tool configured to automatically add an interface interruption along the conductor when it is not possible to add redundant vias. In some embodiments, the router may add interface interruptions, at intervals less than the SIV formation characteristic length. For example, interface interruptions may be added every 10-25 μm on lines that otherwise would not have intermediate length or other vias sufficiently present. In alternative embodiments, interface discontinuities are added at via locations, which may involve an etch procedure modified to remove the barrier or other cladding material. In an embodiment where the interface interruption layer is the same as the interconnect barrier layer, it may be possible to tailor an additional amount of overetch in the via etch process to provide adequate etching of the interface interruption layer. A design-for-manufacturing (DFM) script or customized tiling script or other set of computer-executable instructions may be used to incorporate the interface interruptions.

Although described below in connection with several copper-based metallization examples, the disclosed embodiments may be useful in connection with various metallization arrangements. For example, the disclosed embodiments may be useful in connection with metallization arrangements having various barrier materials (e.g., Ta, TaN, and TiN) and any dielectric material in which the metallization is disposed. Examples of suitable dielectric materials include tetraethyl orthosilicate (TEOS), fluorinated TEOS (FTEOS), carbon-doped oxide dielectrics (e.g., SiCOH), and Black Diamond II™ (BDII) dielectric available from Applied Materials of Santa Clara, Calif. The SIV formation characteristic length may vary based on the material(s), depth, arrangement, fabrication process, barrier material(s), or other characteristic of the metallization.

Narrow conductors or interconnects are those with a width up to about three times the minimum line dimension of the semiconductor device being designed or fabricated. In some embodiments, narrow conductors or interconnects are those with a width up to about two times the minimum line dimension. The minimum line dimension may correspond with the minimum interconnect line width. Narrow conductors may thus have a width that falls anywhere between about one to about three times the minimum line dimension. Wide conductors are those with a width of about three or more times the minimum line dimension. The minimum line dimension may vary based on the technology, or technology node, used to fabricate the semiconductor device. The technology may include or involve the semiconductor materials, e.g., the substrate, the metallization materials, and other materials used in the semiconductor device. The technology may also include or involve photolithography and other aspects of the fabrication processes. For these reasons, the minimum line dimension may vary considerably. For instance, different technology nodes may have a minimum line dimension that ranges from about 50 nm to about 210 nm, such as 70, 90, or 130 nm. Other minimum line dimensions may be used. The technology node may have other minimum dimensions, such as a minimum gate dimension.

Long conductors or interconnects are those with a length greater than the SIV formation characteristic length of the conductor or interconnect. The characteristic length may vary based on the metal layer(s) or other materials in and/or around the interconnect, the process by which the interconnect was formed, and other aspects of the interconnect that may, for instance, be determinative of the distribution of vacancies therein. In some embodiments, the characteristic length may fall in a range from about 10 μm to about 30 μm. Alternatively, the characteristic length may fall in a range from about 10 μm to about 25 μm. For example, if the characteristic length is 25 μm, then all interconnects greater than 25 μm are considered to be long interconnects and, thus, may be at risk of SIV formation depending on the width of the interconnect. In some cases, such interconnects are at risk of SIV formation depending on the degree of isolation of the interconnect.

The degree of isolation or line pitch for a given interconnect may be expressed in terms of the metallization or metal coverage of the semiconductor device within an area in proximity to the interconnect. In some embodiments, a given interconnect is considered to be isolated if the line pitch results in less than about 50% of the area is covered by metal. The area may be defined in terms of the minimum line dimension. For example, the area may be defined as the space extending laterally outward from the edges of interconnect about three times the minimum line dimension. In another embodiment, the area may be defined as a larger space, such as five times the minimum line dimension. The line pitch threshold may vary from 50% based on the area under consideration.

Although described herein in connection with interconnect lines, the disclosed embodiments are not limited to a particular interconnect configuration. The term "interconnect" is used herein in a broad sense to include any metal or metal-based conductor configured to establish an electrical connection between two nodes of an electrical circuit or network of the semiconductor device. The terms "line" and "conductor" may be used interchangeably with the term "interconnect." The materials of the interconnect may vary, and may include non-metallic materials in addition to the metal layer(s) thereof. The depth, layer stack, and other cross-sectional characteristics of the interconnects may vary.

FIGS. 1-4 depict a semiconductor device 20 having an interconnect 22. The interconnect 22 may qualify as a narrow and isolated interconnect as described above. The interconnect 22 may have a path length that would exceed the SIV formation characteristic length as described above. The interconnect 22 is configured with an interrupted capping layer interface in accordance with one embodiment to prevent or reduce the risk of SIV formation as described below.

The interconnect 22 includes a barrier layer 24 and a metal layer 26. The barrier layer 24 is disposed along edges of the metal layer 26 and configured to prevent or reduce diffusion of metal from the metal layer 26 into surrounding dielectric layers. The metal layer 26 may include copper, which can, without the barrier layer 24, readily diffuse into adjacent dielectric layers, such as silicon dioxide layers. Such diffusion may result in electrical shorts within the semiconductor device 20. To further protect against such diffusion, a capping layer 28 is disposed over the interconnect 22 as best shown in the cross-sectional views of FIGS. 2-4. In some embodiments, the capping layer 28 is formed by an electroplating process. The capping layer 28 may laterally extend beyond the interconnect 22 slightly as shown in FIGS. 1 and 2.

An interlayer dielectric (ILD) or other dielectric stack 29 may be disposed over the capping layer 28 for passivation of the interconnect 22. The ILD stack 29 may be disposed between metal layers. Any one or more dielectric materials may be used for the ILD stack 29, including, for example, TEOS, FTEOS, SiCOH, and BDII. In some cases, the capping layer 28 may include a dielectric material configured as part of the ILD stack. In such cases, the capping layer 28 may thus laterally extend across the substrate as shown with the ILD stack 29. Alternatively, the capping layer 28 may be patterned in such cases in a manner similar to the embodiment shown in FIGS. 1 and 2. The capping layer 28 may also be patterned to accommodate vias, as described below.

As shown in the plan view of FIG. 1, the interconnect 22 includes a straight-run portion that electrically connects a pair of end vias 30. The end vias 30 couple the interconnect 22 to conductors 32, 34. Each conductor 32, 34 may be disposed in any other metal layer of the semiconductor device 20, including both upper or lower metal layers. To reach the other metal layers, the end vias 30 pass through the ILD stack 29, as shown in FIG. 4. In this example, the interconnect 22 is also coupled to a conductor 36 by an intermediate via 38. The interconnect 22 may have any number of functional or non-functional vias disposed along the length of the interconnect 22 and/or at the ends of the interconnect 22.

The length of the interconnect 22 may present a risk of SIV formation at one or both of the end vias 30 and the intermediate via 38. As shown in FIG. 1, the interconnect 22 has an overall (or path) length L1 defined by the distance between the pair of end vias 30. Lengths L2 and L3 are defined as the distances between a respective one of the end vias 30 and the intermediate via 38. In this example, the lengths L1 and L2 are longer than the SIV formation characteristic length, and the length L3 is shorter than the SIV formation characteristic length. For example, the lengths L1, L2 may be longer than about 10 μm to about 25 μm. The interconnect 22 also has a width W1 less than three times a minimum line dimension of the semiconductor device. Conductors of the length L1 (or L2) and the width W1 are considered long, narrow conductors and, thus, are at risk of SIV formation at each end via 30.

One or more sections of the interconnect 22 are modified, i.e., configured, to prevent or suppress SIV formation at the end vias 30 and the intermediate via 38. The modifications are directed to mitigating stress migration along the interconnect 22. Stress migration may be mitigated by disrupting or interrupting a vacancy diffusion path along the interconnect 22, as described below.

FIG. 2 is a cross-sectional view of an unmodified segment of the interconnect 22. In this example, the interconnect 22 is disposed on or above a dielectric or passivation layer 40, such as an ILD layer. The passivation layer 40 may include one or more dielectric materials, such as silicon dioxide or silicon nitride. Disposed on the passivation layer 40 is a dielectric layer 42, to which the interconnect 22 is adjacent. Any dielectric material may be used for the dielectric layer 42, including, for example, TEOS, FTEOS, SiCOH, and BDII. The interconnect 22 may be disposed in an opening or other trench formed in the dielectric layer 42. In this example, the metal layer 26 of the interconnect 22 includes a metal, such as copper, that serves as a low resistivity or other conduction material for the interconnect 22. The metal layer 26 may include any number of constituent metal layers arranged in a metal stack.

The barrier layer 24 includes barrier material disposed along edges or sidewalls 44 and a bottom side 46 of the interconnect 22. In this example, the barrier material is disposed between and adjacent to the conduction material of the metal layer 26 and the dielectric layer 42. Along the bottom side 46, the barrier material is disposed between and adjacent to the conduction material and the passivation layer 40. The barrier layer 24 may thus prevent or limit any diffusion of the conduction material into the dielectric layer 42 and the passivation layer 40. In some embodiments, the barrier material is tantalum (Ta) or may be Ta-based, such as TaN. Non-tantalum-based barrier materials may be used, such as TiN. Other barrier layer arrangements may be used. For example, one or more additional materials may be disposed along the bottom side 46 of the interconnect 22 between the interconnect 22 and the passivation layer 40.

Diffusion of the conduction material through a top side 48 of the interconnect 22 is prevented or limited by the capping layer 28. The capping layer 28 is disposed adjacent the conduction material along the top side 48 of the interconnect 22. The capping layer 28 may include cobalt tungsten phosphide (CoWP), a combination of CoWP and another dielectric material, such as silicon nitride, and other non-CoWP-based capping materials, such as silicon-rich nitride, TEOS, or other materials used in ILD layers. The capping layer 28 may be a composite structure having any number of constituent layers, e.g., dielectric and non-dielectric layers.

The disposition of the capping layer 28 over the interconnect 22 establishes an interface between the barrier layer 24, the metal layer 26, and the capping layer 28. The interface is positioned along upper corners 50 or edges of the interconnect 22 where the capping layer 28 extends laterally beyond the interconnect 22. The interface at each corner 50 may provide a diffusion path for vacancies in the interconnect 22.

The interconnect 22 is modified to disrupt the diffusion path by interrupting the interface at or along one or more sections of the interconnect 22 with a plate. One example of a plate that provides an interface interruption or discontinuity is shown in the plan view of FIG. 1 and in the cross-sectional view of FIG. 3. The capping layer interface has a discontinuity arising from a disruption plate 52 or strip. In this embodiment, the presence of the disruption plate 52 inhibits the electroplating deposition process such that the capping layer 28 is not disposed over the disruption plate 52. In some cases, the capping layer 28 may form at ends of the disruption plate 52 to slightly overlap the disruption plate 52 as shown in FIG. 4.

In other embodiments, the disruption plate 52 is disposed between the interconnect 22 and the capping layer 28. For example, the electroplating process may be configured to allow the capping layer 28 to grow over the disruption plate 52. In embodiments in which the capping layer 28 includes a dielectric material, the capping layer 28 is deposited using a process other than electroplating, such that the capping layer 28 may cover the disruption plate 52.

As shown in FIG. 1, the disruption plate 52 is disposed on or along a section of the interconnect 22 to interrupt the interface over the interconnect section. The disruption plate 52 is made of a different material than the capping layer 28 to interrupt the interface. In this embodiment, the disruption plate 52 includes the barrier material of the barrier layer 24. Other materials may be used, including, for instance, the conduction material of the metal layer 26, as described below. The material of the disruption plate 52 may be selectively deposited along the section of the interconnect 22 or etched or otherwise patterned to the structure shown after a blanket deposition.

As shown in FIG. 3, the disruption plate 52 extends laterally across the width of the interconnect 22. The disruption plate 52 may be at least as wide as the interconnect 22. The disruption plate 52 is wider than the lateral extent of the barrier material disposed along the sidewalls 44 of the interconnect 22 to extend beyond the corners 50. The disruption plate 52 may thus cover and contact both the conductor material of the metal layer 26 and the barrier layer 24 along the sidewalls 44.

The disruption plate 52 may be dimensioned or sized to minimize or avoid losing the benefits of the capping layer 28. In the lateral dimension, the disruption plate 52 may extend beyond the width of the interconnect 22 by a small amount. For instance, the disruption plate 52 may be wider than the distance between the corners 50, and/or the distance between the outer edges of the barrier layer 24 as shown. The extra lateral extent of the disruption plate 52 may provide a margin for alignment error. For example, the disruption plate 52 may be wider than the interconnect 22 by less than about 20% of the width of the interconnect 22.

The section of the interconnect 22 along which the disruption plate 52 is disposed may have a length shorter than, or substantially shorter than, the straight-run portion of the interconnect 22 shown in FIG. 1. The height of the disruption plate 52 may be less than the width and length dimensions of the disruption plate 52. The disruption plate 52 and other interface interrupting plates described herein are not electrically connected to any other feature of the semiconductor device 20 other than the interconnect 22. The other plates described herein may be similarly dimensioned and configured.

As shown in FIG. 1, the semiconductor device 20 includes another disruption plate 54 on the metal layer 26 at another axial position along the interconnect 22. The disruption plate 54 may be configured similarly to the disruption plate 52. The disruption plate 54 is positioned at the intermediate via 38 to further bifurcate or partition the interconnect 22. In this example, the disruption plates 52, 54 partition the interconnect 22 into three segments of roughly equal length.

The disruption plates 52, 54 may be positioned to define segments of the interconnect 22 having lengths no greater than the SIV formation characteristic length. In this example, the disruption plate 52 is positioned to bifurcate the length L2 of the interconnect 22 into a pair of segments having lengths L4 and L5. One of the facing edges of the disruption plate 52 is spaced from the center of an adjacent one of the end vias 30 by the length L4, and while the other facing edge is spaced from the facing edge of the disruption plate 54 at the intermediate via 38 by the length L5. Each length L4, L5 is no greater than the SIV formation characteristic length. The disruption plate 54 is also spaced from the other end via 30 by a distance no greater than the SIV formation characteristic length. In this example, the disruption plate 54 may be placed at the intermediate via 38 if, for instance, a distance L3 from the center of the intermediate via 38 to the end via 30 is too near or possibly greater than the SIV formation characteristic length. In other embodiments, the presence of the intermediate via 38 may be considered in the positioning of the disruption plates 52, 54, as well as whether a second disruption plate is warranted. The segmentation of the interconnect 22 may thus vary from the example shown.

The interface interruptions or discontinuities in the interface, diffusion path, and/or capping layer 28 provided, in this case, by the disruption plates 52, 54, may be distributed non-uniformly along the interconnect 22 in alternative embodiments. The segments defined by the interruptions or discontinuities may have different lengths. For example, the length L4 may differ from the length L5.

The interface interruptions may be provided by discontinuities in the interface, the diffusion path, and/or the capping layer 28. The discontinuities may help prevent or decrease vacancy migration along the interconnect 22 and thereby prevent or limit void formation at the vias 30, 38. The interruptions or discontinuities are spaced from one another and/or vias 30, 38 along the interconnect 22 so that the interconnect 22 does not qualify as a long conductor. For example, each discontinuity may be disposed along the interconnect 22 to bifurcate or partition the interconnect 22 into segments no greater than the SIV formation characteristic length to reduce the risk of SIV formation.

The cross-sectional view of FIG. 4 depicts both of the disruption plates 52, 54 with several other layers of the semiconductor device 20. The barrier material of the disruption plates 52, 54 is deposited after the metal layer 26 is deposited. In some cases, metallization, including the formation of the barrier layer 24, is completed before the additional barrier material of the disruption plates 52, 54 is deposited. In this embodiment, the barrier material of the disruption plates 52, 54 is deposited before the capping layer 28 is electroplated or otherwise deposited. The selective deposition of the barrier material of the disruption plates 52, 54 may be achieved by ion-beam deposition, e.g., ion-beam induced deposition. With ion-beam deposition, a minimum feature size of 0.7 nm may be obtained. However, the disruption plates 52, 54 may have a length, i.e., the dimension shown in FIG. 4, greater than the minimum feature size in the interest of sufficiently interrupting or disrupting the vacancy path, but not too large so as to not disrupt the electromagnetic benefits of the presence of the capping layer 28. The length of the disruption plates 52, 54 (or other interruption layer) may be driven by minimum line width and area design rules. For example, the length may be slightly larger than the design rules for manufacturability. In some cases, the interruption is as small as possible from a manufacturability standpoint. The selective deposition of the barrier plates 52, 54 may then be followed by the formation of the capping layer 28 and other subsequent processing. For example, the capping layer 28 and the disruption plate 54 are patterned to define an opening for the intermediate via 38.

The shape, size, and other characteristics of the disruption plate 52, 54 may vary from the single slab or strip shape that extends laterally across the interconnect 22 of the embodiment of FIGS. 1-4. For example, each disruption plate 52, 54 may be configured as a dual-strip feature or structure, with a respective strip of the disruption plate disposed along each edge of the interconnect 22. The strips of the plate may, but need not, be connected to one another by barrier material along the top of the interconnect 22. In some cases, the edges of the interconnect 22 may thus be covered by separate strips. A single portion of the disruption plate thus need not extend laterally across the interconnect 22, as in the example shown. The disruption plate need not be elongated in either lateral dimension. For example, the disruption plate may be square-shaped when viewed from above. The thickness of the disruption plate may also vary.

Any number of disruption strips or other plate-shaped features may be disposed along the interconnect 22 disposed between the end vias 30. Each disruption feature may be disposed in or along a section or position of the interconnect 22 to bifurcate or partition the interconnect 22 into segments shorter than the SIV formation characteristic length. The disruption features may or may not be located at an intermediate via along the interconnect 30.

As shown in FIG. 4, the dielectric layer 42 and the interconnect 22 are supported by a substrate 56. In this example, the interconnect 22 is disposed in a first metal layer, e.g., an M1 layer, above the substrate 56. The interconnect 22 may be disposed in any metal layer of the semiconductor device 20. The barrier layer 24 may be disposed on the passivation layer 40.

The interconnect 22, the vias 30, 38, the conductors 32, 34, and other metallization may be formed with copper (Cu) layers, such as electroplated Cu layers. The metallization may be formed via damascene processes. In one embodiment, the vias 30, 38 are formed with another metal layer, such as the conductors 32, 34, through a dual damascene process. The metallization may include alternative or additional metals arranged in a composite structure or metal stack. For example, the metallization may include one or more transition layers and/or a seed metal layer to facilitate an electroplating process used to form additional layers. Other deposition processes may be used, such as sputtering.

Figure 6:
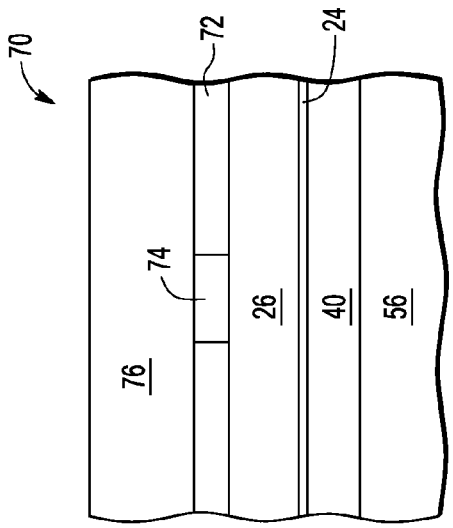
FIG. 6 is a schematic, simplified, cross-sectional view of yet another semiconductor device having an interconnect with an interrupted capping layer interface configured for stress migration mitigation in accordance with one embodiment.
Figure 5:
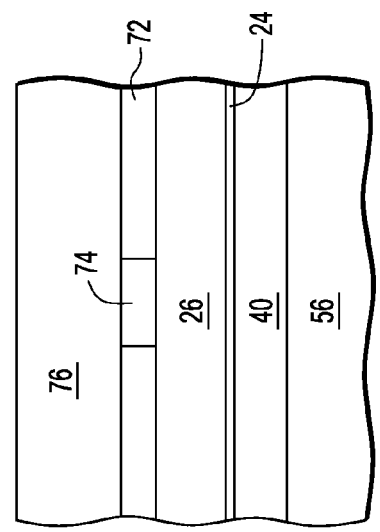
FIG. 5 is a schematic, simplified, cross-sectional view of another semiconductor device having an interconnect with an interrupted capping layer interface configured for stress migration mitigation in accordance with one embodiment.

FIGS. 5 and 6 are cross-sectional views of alternative embodiments in which the capping layer interface and, thus, vacancy diffusion path, are interrupted with a different type of plate-shaped discontinuity. The feature that disrupts the diffusion path along the interface in these embodiments involves a discontinuity in the capping layer in which a plate is disposed. The discontinuity is formed at a section of the interconnect by patterning the capping layer. A material other than the material of the capping layer may then be deposited in the opening formed by the patterning. The material may form a cladding for the metal layer of the interconnect that extends over the metal layer in a manner similar to the embodiments described above. Furthermore, the cladding layer may subsequently be removed in regions other than the opening by a patterned etching.

FIG. 5 depicts a semiconductor device 60 having a number of structures and features in common with the embodiments described above. For example, an interconnect includes barrier layer 24 and metal layer 26. The interconnect is disposed on dielectric layer 40, which is supported by substrate 56. The semiconductor device 60 also includes a capping layer 62, which, in turn, includes a discontinuity at a section of the interconnect. In this example, the discontinuity is configured as an opening that exposes the metal layer 26. The opening in the capping layer dielectric 62 may extend across and beyond the lateral extent or width of the metal layer 26.

To interrupt the diffusion path at the capping layer interface, a material other than the capping layer material is disposed in the discontinuity of the capping layer 62. In this example, barrier material is disposed in the opening and, thus, forms a cladding for the metal layer 26. Any barrier material suitable for the barrier layer 24 may be used to fill the opening. To that end, a plate 64 of barrier material is deposited after the deposition and patterning of the capping layer 62. The barrier material of the plate 64 may be disposed over the capping layer 62, and extend along the interconnect, outside of the discontinuity of the capping layer 62, as shown. The plate 64 may be dimensioned as described above in connection with the embodiment of FIG. 3. The plate 64 need not have the same thickness as the capping layer 62. An ILD layer 66 may be deposited on the plate 64 in preparation for further metallization and/or other processing. Furthermore, the preparation may include subsequently removing such layers in regions away from the opening by a patterned etching.

FIG. 6 depicts another semiconductor device 70 having an opening or discontinuity in a capping layer 72 to interrupt the capping layer interface at a section of an interconnect. The semiconductor device 70 may have a number of structures and features in common with the embodiments described above. For example, the interconnect includes barrier layer 24 and metal layer 26. The interconnect is disposed on dielectric layer 40, which is supported by substrate 56. In this embodiment, a plate 74 of a conduction material of the metal layer 26 is disposed in the discontinuity of the capping layer 72. For example, the plate 74 may include Cu. Other metals may be used, including, for instance, a metal used as a constituent layer of a metal stack used to form the metal layer 26. For example, a metal used in a transition layer may be used. The plate 74 may be dimensioned as described above in connection with the embodiment of FIG. 3. The plate 74 need not have the same thickness as the capping layer 72.

Embodiments in which Cu is used to fill the opening, define the cladding, and disrupt the capping layer interface may be configured to minimize the effects of any diffusion of the Cu into an adjacent dielectric layer, such as an ILD layer 76. For example, the opening in the capping layer 72 may be sized to minimize the amount of Cu available for diffusion, while still serving as an effective interface interruption. Alternatively or additionally, the ILD layer 76 (and/or subsequent metallization) may be configured to minimize the effects of any diffusion. For example, the ILD layer 76 may have a thickness that sufficiently reduces the likelihood of an electrical short.

Figure 7:
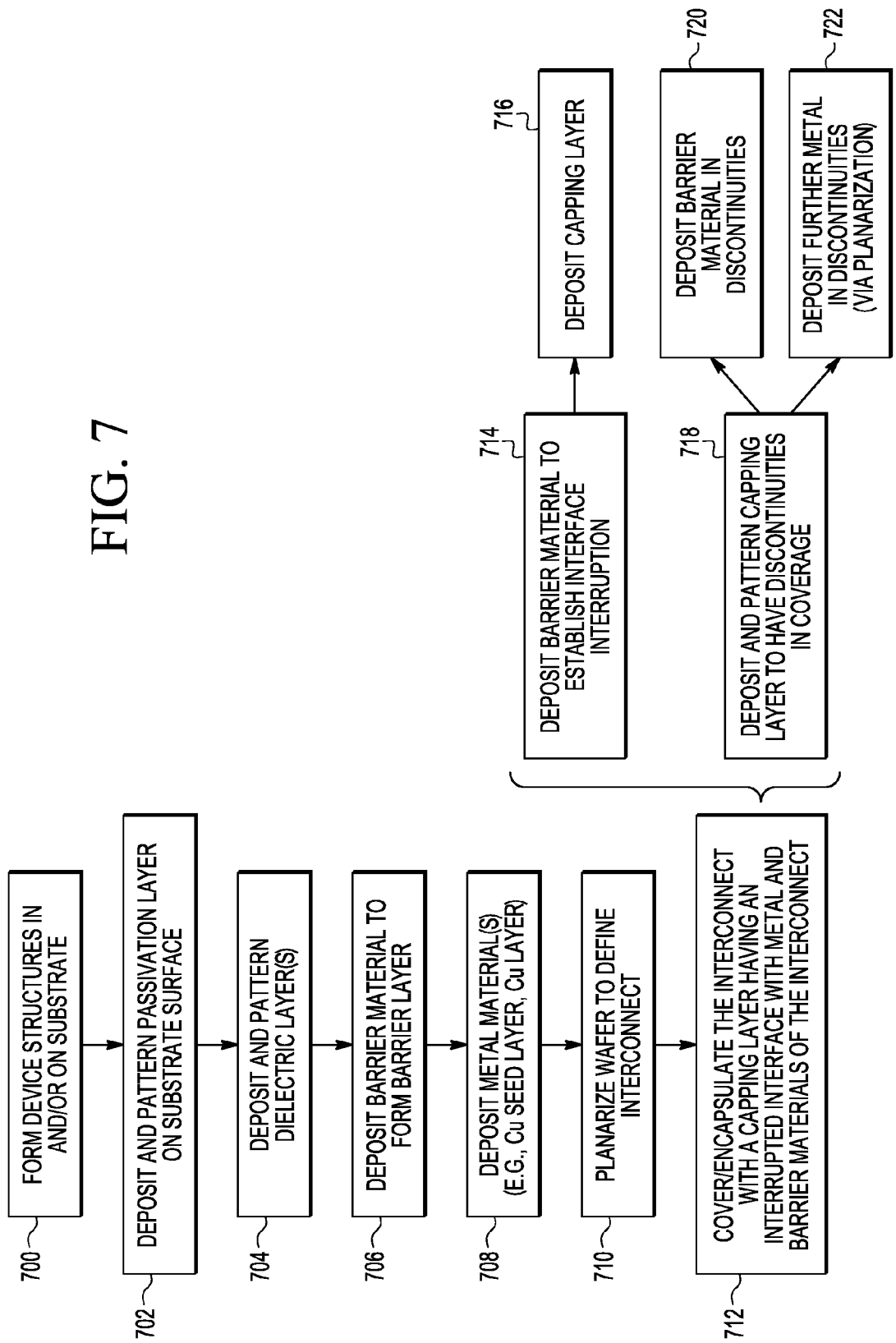
FIG. 7 is a flow diagram of an exemplary method of fabricating a semiconductor device having an interconnect configured for stress migration mitigation in accordance with one embodiment.

FIG. 7 depicts a method of fabricating a semiconductor device, such as the semiconductor devices described above. The semiconductor device may incorporate a capping layer interface discontinuity or interruption for mitigating stress migration in an interconnect of the semiconductor device. The method includes a sequence of acts or steps, only the salient of which are depicted for convenience in illustration. Additional, fewer, or alternative steps may be implemented. For example, additional metal layers may be deposited, any one or more of which may have an interconnect configured as described herein.

The method includes the deposition of various dielectric and metal materials. As described above, the disclosed embodiments are not limited to any particular dielectric or metal material. The disclosed embodiments rely on layout-based techniques to mitigate stress migration, and thus are compatible with a wide variety of dielectric and metal materials.

The method may begin with, or include, an act 700 in which device structures are formed in a substrate. The device structures may be configured to define a number of transistor or other devices formed in and/or supported by the substrate. The substrate may include a semiconductor substrate. A variety of semiconductor materials may be used, including elementary semiconductors, such as Si, and compound semiconductors, such as GaAs. Other compound and non-compound semiconductor materials may be used. The substrate may be a lightly or heavily doped p-type or n-type substrate. Alternatively or additionally, the substrate includes non-semiconductor materials. For example, the substrate may be configured as a semiconductor-on-insulator (SOI) substrate. The substrate may be a bulk semiconductor wafer. Other types of semiconductor substrates may be used. In some cases, the substrate is a composite substrate with any number of layers (e.g., epitaxial layers). For example, the substrate may include an original p-type semiconductor substrate on which the insulator, epitaxial, or other layers are grown or otherwise formed.

A passivation layer may be deposited over the substrate in an act 702. The passivation layer may be deposited on the surface of the substrate. The passivation layer may include any one or more dielectric materials. The act 702 may include patterning of the passivation layer to form openings for, e.g., contacts and/or other structures supported by the substrate. Alternatively or additionally, one or more active layers are deposited and formed on the surface of the substrate. The active layers may include a variety of different materials and structures supported by the substrate.

A number of acts are then directed to forming an interconnect in a manner that suppresses SIV formation as described above. The interconnect has a width less than three times a minimum line dimension of the semiconductor device, as described above. In this example, the interconnect is formed in a first metal layer, e.g., M1, for which a dielectric layer is deposited and patterned in an act 704. The patterning may define a trench in the dielectric layer for the interconnect. After the patterning of the dielectric layer, barrier material is then deposited in an act 706 to form a barrier layer in the interconnect trench. The barrier layer may be disposed along sidewalls and a bottom side of the trench, as described above. One or more conduction materials of the interconnect are then deposited on the barrier layer in an act 708. The conduction materials may include Cu and/or other metals. The act 708 may include the deposition of a seed layer and an electroplating process, or other process, such as a sputtering process. In act 710, the interconnect is defined in the trench through patterning of the metal material through the implementation of a planarization process. For example, the planarization may include a damascene process involving a chemical-mechanical planarization (CMP) process. In an alternative embodiment (e.g., with the interconnect disposed in a higher metal layer), the definition of the interconnect may be implemented concurrently with the filling of vias in a dual damascene process.

In act 712, the interconnect is covered with a capping layer that establishes an interface between the conduction material, the barrier material, and the capping layer. As described above, the interface is interrupted at or along one or more sections of the interconnect through the formation of a plate. FIG. 7 depicts a number of different options for interrupting the interface with a plate as part of the act 712. In some embodiments, the act 712 includes depositing barrier material in act 714 to establish the interface interruption before the capping layer is deposited in an act 716. The barrier material may be configured as a plate disposed on or along a section of the interconnect as described above. Furthermore, the barrier layer may subsequently patterned and etched. The barrier material may be selectively deposited on the section by implementing an ion beam-induced deposition process to define the plate of the barrier material. As described above, the section partitions the interconnect into a pair of segments, each segment having a length no greater than a stress-induced void (SIV) formation characteristic length.

Alternatively, the capping layer is deposited in an act 718 and patterned to have one or more discontinuities in coverage of the interconnect. A plate of the barrier material may then be deposited in the discontinuities in an act 720, and may be followed by a patterned etch. Other interface-interrupting materials may be deposited in other embodiments. For example, a plate of metal may be deposited in the discontinuities in an act 722, which may include another planarization process to limit the metal to the discontinuities.

The method may include a number of other additional acts related to the interconnect. For example, an interlayer dielectric (ILD) layer may be deposited over as shown and described in connection with the cross-sectional views of FIGS. 5 and 6. The ILD layer may then be patterned to form holes for vias. The above-described fabrication process may then be repeated to form interconnects in one or more additional metal layers.

Figure 8:
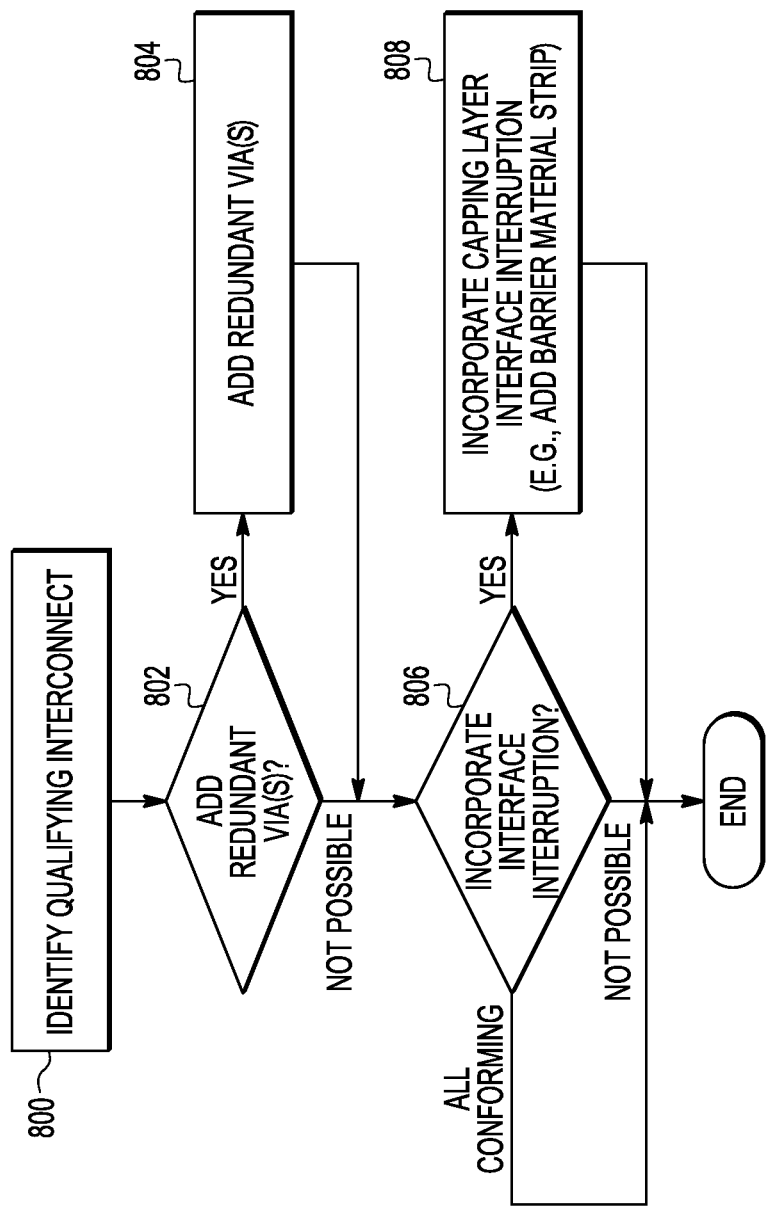
FIG. 8 is a flow diagram of a method of configuring a semiconductor device having an interconnect in accordance with one embodiment.

FIG. 8 depicts a method of configuring a semiconductor device. The method may be configured in accordance with a design methodology that incorporates one or more of the capping layer interface interruptions of the embodiments described above to mitigate stress migration in the interconnects of the semiconductor device. For example, the methodology may be implemented as a set of design rules of a design for manufacturing (DFM) methodology. The method may be computer-implemented. For example, the method may be implemented by a computer-implemented router. The router may include a computer-readable storage medium in which instructions are stored to configure a processor of the router to implement the method. For example, the method may be implemented via a DFM script or customized tiling script. The method includes a sequence of acts or steps, only the salient of which are depicted for convenience in illustration. Additional, fewer, or alternative steps may be implemented. For example, the method may form a part of a broader method of configuring the metal layers of the semiconductor device.

The method may begin in an act 800 in which a qualifying interconnect is identified. A qualifying interconnect may have a width less than three times a minimum line dimension of the semiconductor device, as well as an interconnect path length greater than the SIV formation characteristic length of the semiconductor device. In some cases, a decision block 802 then determines whether it is possible to add redundant vias to the interconnect. The redundant vias may be added near other functional vias, e.g., at the ends of the interconnect. Alternatively or additionally, the redundant vias may be added to bifurcate or otherwise partition the interconnect path length into segments shorter than the SIV formation characteristic length. In either case, the determination may be based on whether there is space available for the redundant via(s). If there is via space available, control passes to an act 804 in which the redundant via(s) are added. Redundant vias may be placed at the functional via locations in close proximity to each other to allow the distribution of vacancies. The number of vias and the spacing requirements may be a function of the technology node and connecting line lengths. The placement rules may specify placing a certain number of vias at a spacing less than a first predetermined value. If that is not possible given layout constraints, the placement rules may specify placing a larger number of vias at a second predetermined spacing greater than the first predetermined value. In some cases, there may be space to effectively treat some sections of the interconnect, while insufficient space exists in other sections. In such cases, the interconnect may be modified by a combination of redundant vias and one or more capping layer interface interruptions. For example, stress migration may be mitigated in an interconnect by incorporating a combination of redundant vias and decoy vias.

Control then passes to a decision block 806 that determines whether to incorporate a capping layer interface interruption. If redundant vias have been added such that all interconnects are conforming, then the method may terminate. For example, the interconnects may either have sufficiently short path lengths or were partitioned into segments not greater than the SIV formation characteristic length during the act 804.

If there was not sufficient via space available for one or more interconnects, control may pass to a decision block 806 that determines whether to incorporate a capping layer interface interruption. For example, the determination may include analyzing whether there is sufficient space for other techniques directed to addressing the width or isolation of the interconnect. Alternatively or additionally, the determination may analyze whether there are any layout or other practical constraints that would inhibit incorporating an interface interruption as described herein. If there are no such constraints, then control passes to an act 808 in which a capping layer interface discontinuity or interruption is incorporated into the interconnect(s). The interruption may include a barrier material strip or other plate that disrupts the interface in the form of a mask feature, or a plate disposed in a discontinuity in the capping layer itself, as described above.

The incorporation of the interface interrupting strips or other plates may continue until all of the interconnects are partitioned into sufficiently short segments, or until it is no longer possible to incorporate any further interruptions. In some embodiments, the method may terminate even if one or more qualifying interconnects remain unaddressed due to lack of available space for a redundant via or interface interruption. In DFM embodiments, the method may nonetheless be considered to have successfully mitigated the risk of stress migration to the greatest practical extent. The compliance rate with the SIV formation characteristic length may be sufficiently high to achieve satisfactory yields.

Figure 9:
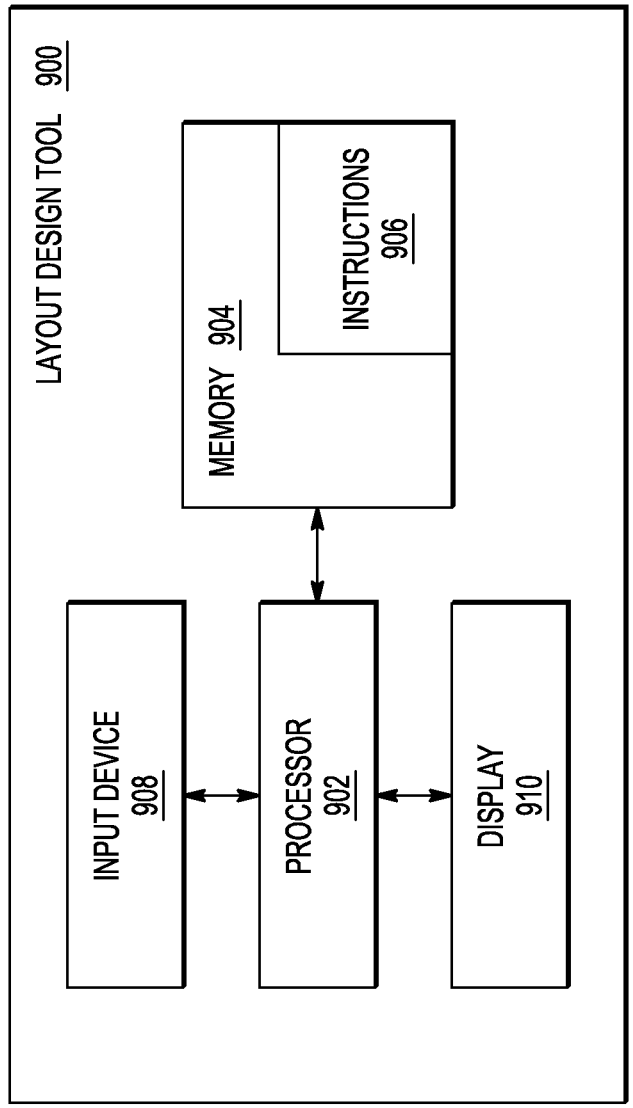
FIG. 9 depicts an exemplary layout design tool for implementing the method of FIG. 8.

FIG. 9 depicts an exemplary layout design tool 900 for implementing the method of FIG. 8. The layout design tool 900 may be a computer system including a set of instructions that, when executed, cause the computer system to perform the acts, steps, and other functions described above. The layout design tool 900 may operate as a standalone device or may be connected, e.g., using a network, to other computer systems or peripheral devices. In a networked deployment, the layout design tool 900 may operate as a server or as a client computer. The layout design tool 900 may be implemented as or incorporated into various computing devices, such as a personal computer, a tablet, a personal digital assistant or other mobile device, or any other machine capable of executing a set of instructions that specify actions to be taken by the machine. While the layout design tool 900 is illustrated as a single computer system, the terms "tool" and "system" may include any number or collection of systems or devices that individually or jointly execute one or more sets of instructions to implement the methods described herein.

The layout design tool 900 includes a processor 902, such as a central processing unit (CPU), and a memory 904 in communication with, or otherwise coupled to, the processor 902. The processor 902 may be a component in a variety of systems. For example, the processor 902 may be part of a standard personal computer or a workstation. The processor 902 may be one or more general processors, digital signal processors, application specific integrated circuits, field programmable gate arrays, servers, networks, digital circuits, analog circuits, combinations thereof, or other now known or later developed devices for analyzing and processing data. The processor 902 may implement a software program, such as instructions 906 stored in the memory 904.

The memory 904 is or includes a computer-readable storage medium, such as a main memory, a static memory, or a dynamic memory. The memory 904 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. The memory 904 may include one or more memories or data storage devices. In one embodiment, the memory 904 includes a cache or random access memory for the processor 902. In alternative embodiments, the memory 904 is separate from the processor 902, such as a cache memory of a processor, the system memory, or other memory. The memory 904 may be an external storage device or database for storing data. Examples include a hard drive or other drive unit, such as a compact disc ("CD") or digital video disc ("DVD") drive unit, memory card, memory stick, floppy disc, universal serial bus ("USB") memory device, or any other device operative to store data.

The memory 904 may communicate with the processor 902 and other components of the layout design tool 900 via a bus or other communication link.

The layout design tool 900 may include an input device 908 configured to allow a user to interact with any of the components of the computer system. The input device 908 may be a microphone, a keyboard, a cursor control device, such as a mouse, or a joystick, touch screen display, or touchpad, or any other remote control or other device operative to interact with the computer system.

The layout design tool 900 may include a display unit 910, such as a liquid crystal display (LCD), an organic light emitting diode (OLED), a flat panel display, a solid state display, a cathode ray tube (CRT), a projector, a printer or other now known or later developed display device for outputting determined information. The display 910 may act as an interface for the user to see the functioning of the processor 902, or specifically as an interface with the software stored in the memory 904.

The instructions 906 may include or specify a program, software, software application, script, or code. The instructions 906 may be written in any form of programming language, including compiled or interpreted languages. The instructions 906 be stored in any form, including as a standalone program or as a module, component, subroutine, or other unit suitable for use in a computing environment. The instructions 906 do not necessarily correspond to a file in a file system. The instructions 906 may be stored in a portion of a file that holds other programs or data (e.g., one or more scripts stored in a markup language document), in a single file dedicated to the program in question, or in multiple coordinated files (e.g., files that store one or more modules, sub programs, or portions of code). The instructions 906 may be stored or configured to be executed on one computer or on multiple computers that are located at one site or distributed across multiple sites and interconnected by a communication network.

In one aspect, a semiconductor device includes a substrate, a dielectric layer supported by the substrate and an interconnect adjacent the dielectric layer, the interconnect including a conduction material and a barrier material disposed along sidewalls of the interconnect between the conduction material and the dielectric layer. The semiconductor device further includes a layer disposed over the interconnect that establishes an interface between the conduction material, the barrier material, and the layer. A plate is disposed along a section of the interconnect to interrupt the interface.

In a second aspect, a method of fabricating a semiconductor device includes depositing a dielectric layer over a substrate, patterning the dielectric layer to define an interconnect trench, depositing a barrier layer in the interconnect trench, the barrier layer including a barrier material, depositing a conduction material on the barrier layer in the interconnect trench, implementing a planarization process to define an interconnect in the interconnect trench, covering the interconnect with a capping layer that establishes an interface between the conduction material, the barrier material, and the capping layer, and forming a plate along a section of the interconnect to interrupt the interface.

In a third aspect, a method of configuring a semiconductor device includes identifying an interconnect having a width less than three times a minimum line dimension of the semiconductor device and having an interconnect path length greater than a stress-induced void formation characteristic length of the semiconductor device, determining whether space is available to add a redundant via to the interconnect at a position along the interconnect to define a pair of segments of the interconnect having respective lengths no greater than the stress-induced void formation characteristic length, and if the space is not available, incorporating a plate to interrupt an interface between a conduction material, a barrier material, and a capping layer of the interconnect at the position along the interconnect to define the pair of segments of the interconnect having respective lengths no greater than the stress-induced void formation characteristic length.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising:
a substrate;
a dielectric layer supported by the substrate;
an interconnect adjacent the dielectric layer, the interconnect comprising a conduction material and a barrier material disposed along first and second sidewalls of the interconnect between the conduction material and the dielectric layer, the first and second sidewalls being disposed along opposite sides of the interconnect;
a layer disposed over the interconnect that establishes first and second interfaces along the first and second sidewalls, respectively the first and second interfaces being between the conduction material, the barrier material, and the layer; and
at least one plate disposed along a section of the interconnect and extending across and contacting the barrier material to interrupt the first and second interfaces.

2. The semiconductor device of claim 1, wherein the at least one plate comprises a strip of the barrier material disposed on the conduction material along the section of the interconnect.

3. The semiconductor device of claim 1, wherein the layer disposed over the interconnect comprises a discontinuity at the section of the interconnect in which the at least one plate is disposed.

4. The semiconductor device of claim 3, wherein the at least one plate comprises a layer of the conduction material disposed in the discontinuity.

5. The semiconductor device of claim 3, wherein the at least one plate comprises a layer of the barrier material disposed in the discontinuity.

6. The semiconductor device of claim 5, wherein the layer of the barrier material extends along the interconnect over the layer disposed over the interconnect outside of the discontinuity.

7. The semiconductor device of claim 1, wherein the at least one plate is wider than a lateral extent of the barrier material disposed along the first and second sidewalls of the interconnect.

8. The semiconductor device of claim 1, wherein the at least one plate is not electrically connected to any feature of the semiconductor device other than the interconnect.

9. The semiconductor device of claim 1, wherein the at least one plate is dimensioned such that a height of the at least one plate is less than a width of the at least one plate and is less than a length of the at least one plate.

10. The semiconductor device of claim 1, wherein the section of the interconnect is shorter than a straight-run portion of the interconnect.

11. The semiconductor device of claim 1, wherein the section of the partitions the interconnect into a pair of segments, each segment having a length no greater than a stress-induced void (SIV) formation characteristic length.

12. The semiconductor device of claim 11, wherein the SIV formation characteristic length falls in a range from about 10 μm to about 25 μm.

13. The semiconductor device of claim 1, wherein the interconnect has a width less than three times a minimum line dimension of the semiconductor device.

14. The semiconductor device of claim 1, wherein the conduction material comprises copper.

15. The semiconductor device of claim 1, wherein the at least one plate comprises a single plate that extends laterally across an entire width of the interconnect.

16. The semiconductor device of claim 1, wherein the at least one plate comprises a single plate that extends laterally across the first and second sidewalls of the interconnect.

17. The semiconductor device of claim 1, wherein the at least one plate comprises a single plate that extends beyond a width of the interconnect.

* * * * *